(12) United States Patent
Salisbury

(10) Patent No.: US 10,775,446 B2
(45) Date of Patent: Sep. 15, 2020

(54) TRANSIENT STRAY VOLTAGE DETECTOR AND SYSTEM

(71) Applicant: Noble M. Salisbury, Chatfield, MN (US)

(72) Inventor: Noble M. Salisbury, Chatfield, MN (US)

( * ) Notice: Subject to any disclaimer, the term of this patent is extended or adjusted under 35 U.S.C. 154(b) by 182 days.

(21) Appl. No.: 15/921,519

(22) Filed: Mar. 14, 2018

(65) Prior Publication Data

US 2018/0267091 A1    Sep. 20, 2018

Related U.S. Application Data

(60) Provisional application No. 62/471,341, filed on Mar. 14, 2017.

(51) Int. Cl.
*G01R 31/50* (2020.01)
*H02B 1/03* (2006.01)
*A01K 29/00* (2006.01)
*H02B 1/20* (2006.01)
*H02B 1/16* (2006.01)
*G01R 31/52* (2020.01)
(Continued)

(52) U.S. Cl.
CPC .............. *G01R 31/50* (2020.01); *A01K 29/00* (2013.01); *G01R 31/52* (2020.01); *H02B 1/03* (2013.01); *H02B 1/16* (2013.01); *H02B 1/20* (2013.01); *G01R 19/02* (2013.01); *G01R 19/2513* (2013.01)

(58) Field of Classification Search
CPC .. G01R 31/025; G01R 19/2513; G01R 19/02; G01R 31/50; G01R 31/52; H02B 1/16; H02B 1/20; H02B 1/03; A01K 29/00
See application file for complete search history.

(56) References Cited

U.S. PATENT DOCUMENTS

| 5,321,318 A | 6/1994 | Montreuil |
| 7,394,259 B2 | 7/2008 | Fitzgerald |

(Continued)

OTHER PUBLICATIONS

Zipse, Donald W., Dangers of Stray Voltage and Stray Current, Jun. 2002.

(Continued)

*Primary Examiner* — Amy He
(74) *Attorney, Agent, or Firm* — Jeffrey D. Shewchuk; Shewchuk IP Services, LLC

(57) ABSTRACT

A directional flow current transducer is used as a transient stray voltage detector including a first transducer providing an output signal indicating the magnitude of stray current carried by a new grounding wire, and a second, separate transducer providing an output signal indicating the direction of the stray voltage (for either direct and/or alternating stray voltages). The new grounding wire might be between an equi-potential plane of a concrete platform for watering livestock and a grounding bus bar for grounding the service bond of the main electrical service panel, at a significant distance from the watering platform. The output of the directional flow current transducer is recorded, stored and analyzed as a function of time. Preferably by allowing comparison with the output of a second directional flow current transducer, the system allows transient, directional and locational stray voltage/stray current problems to be better identified, understood and addressed.

19 Claims, 2 Drawing Sheets

(51) Int. Cl.
    *G01R 19/02*     (2006.01)
    *G01R 19/25*     (2006.01)

(56) References Cited

U.S. PATENT DOCUMENTS

| | | |
|---|---|---|
| 7,405,670 B2 | 7/2008 | Fitzgerald |
| 8,760,837 B2 | 7/2014 | Straubhaar |
| 9,021,986 B2 | 5/2015 | Straubhaar |
| 2011/0308472 A1* | 12/2011 | Straubhaar ............... A01K 7/00 119/72 |
| 2012/0123708 A1* | 5/2012 | Dong ................... G01R 31/025 702/58 |
| 2016/0148486 A1 | 5/2016 | Kalokitis et al. |

OTHER PUBLICATIONS

Reinemann, Douglas J., What Do We Know About Stray Voltage?, Apr. 2009.

Minnesota Rural Electric Association, Minnesota Stray Voltage Guide, Sep. 2015.

CR Magnetics, Using External Current Transformers With Other CR Devices, publication date unknown.

CR Magnetics, Using the CR4220/60 Series Current Transmitter, publication date unknown.

CR Magnetics, Developing Voltage From 4-20mA Current Loops, publication date unknown.

CR Magnetics, Average RMS AC Current Transducer, publication date unknown.

CR Magnetics, AC Power Transducer, publication date unknown.

\* cited by examiner

TRANSIENT STRAY VOLTAGE DETECTOR AND SYSTEM

CROSS-REFERENCE TO RELATED APPLICATION(S)

This application claims priority from Provisional Application No. 62/471,341, filed Mar. 14, 2017, entitled STRAY VOLTAGE DETECTION, MEASUREMENT AND LOGGING. The contents of Provisional Application No. 62/471,341 are incorporated by reference in entirety.

BACKGROUND OF THE INVENTION

The present application relates to stray voltage, and particularly to stray voltage as it affects livestock and the production of such livestock, such as the production of milk by cows on a dairy farm. Stray voltage is a small voltage, generally considered less than 10 V, which may exist between two locations or objects. Stray current is the current produced by stray voltage, generally less than 1 Amp if carried on a 10Ω circuit. When an animal connects the two locations or objects, electricity may flow through the body of the animal. Livestock may avoid certain stray voltage/ stray current exposure locations, which may result in a) reduced water intake that may result if annoying or painful exposure is required for animals to access watering devices; b) reduced feed intake that may result if annoying or painful exposure is required for animals to accesses feeding devices or locations, c) difficulty of moving or handling animals in areas of annoying or painful voltage/current exposure; or d) the release of stress hormones produced by contact with painful stimuli.

The existence and detrimental effect of such stray voltage and stray current is the subject of numerous published studies. As a result of such studies, the desire to minimize stray voltage and stray current has become accepted, and the U.S. federal government and several states (including Minnesota) have set out guidelines or standards for defining and acceptable stray voltage levels in agricultural or livestock settings. See for instance the Unites States Department of Agriculture Handbook 696 titled "Effects of Electrical Voltage/Current on Farm Animals: How to Detect and Remedy Problems (commonly referred to as the Red Book) and the "Minnesota Stray Voltage Guide—A Guide Addressing Stray Voltage Concerns", setting forth that stray voltage levels in excess of a threshold of 0.5 Volts should be avoided and/or addressed. It is quite possible that the 0.5 Volt stray voltage threshold for taking corrective action may change in the future as further study is conducted. See also National Electrical Code section 250.6.

The existence and detrimental effect of stray voltage or stray current is also the subject of several patent documents. U.S. Pat. No. 5,321,318 to Montreuil discloses a system for sensing stray current, which injects a compensatory current in various locations in the ground return circuit associated with one or more saturable reactors. U.S. Pat. Nos. 7,394,259 and 7,405,670 to Fitzgerald disclose a stray voltage detection and isolation system disposed on a water delivery system, and U.S. Pat. Nos. 8,760,837 and 9,021,986 to Straubhaar disclose a system for monitoring and mitigating stray voltage which measures electrical currents flowing through a water pipe.

In general, however, existing guidelines, standards and patent solutions fail to acknowledge and adequately consider the transient and locational nature of stray voltage/current. Stray voltage/current can change significantly over time as electrical conditions and weather conditions on the farm or dairy barn change over time. The best solution to ameliorate stray voltage/current often depends upon the transient nature of the stray voltage or current being witnessed. Further, the direction and/or location where stray voltage/stray current exists can change from time to time, particularly depending upon the root cause of the stray voltage/stray current. Many stray voltages are caused by utility companies, as they providing insufficient wiring for their electrical grid and use the earth to complete circuits. Other stray voltages are caused by mother nature, such as the result of weather patterns, lightening strikes, etc., some of which are recurring or regular in when they occur. Other stray voltages/stray currents are caused by improper wiring of the electrical system including an improper neutral-to-ground connection, by improperly using the grounding path to carry neutral current, and by short circuits or other electrical insulation problems in the electrical equipment on the farm. Some stray voltage causes create stray voltages which are largely direct current, while other stray voltage causes create stray voltages which are primarily alternating current. One type of stray voltage/stray current might affect the farm or dairy barn in one location or one direction, while stray voltage/ stray current resulting from a different cause might affect the farm or dairy barn in a different location or different direction. Better methods and systems are needed to identify stray voltage issues and particularly transient, directional and locational stray voltage/stray current issues. More information about transient, directional and locational stray voltages/currents and their effect on livestock may also lead to better, more accurate and more timely correction of electrical sources creating the identified stray voltage/current problems.

BRIEF SUMMARY OF THE INVENTION

The present invention is a transient stray voltage detector as well as a system using a transient stray voltage detector and a method of monitoring stray voltage, based off of monitoring of current. The transient stray voltage detector is deployed on a new grounding wire connecting to the equipotential ground plane on a farm, and preferably in a second location involving an existing grounding wire, both relative to the main service bond. In one aspect, the detector includes a first transducer providing an output signal indicating the magnitude of stray current carried by the new grounding wire, and a second, separate transducer providing an output signal indicating the direction of the stray voltage (for either direct and/or alternating stray voltages). The combination of the two transducers, referred to as a directional flow current transducer, has its output logged as a function of time, preferably allowing comparison with the output of the second directional flow current transducer, thereby allowing transient, directional and locational stray voltage/stray current problems to be better identified, understood and addressed.

While the above-identified drawing figures set forth a preferred embodiment, other embodiments of the present invention are also contemplated, some of which are noted in the discussion. In all cases, this disclosure presents the illustrated embodiments of the present invention by way of representation and not limitation. Numerous other minor modifications and embodiments can be devised by those skilled in the art which fall within the scope and spirit of the principles of this invention.

DETAILED DESCRIPTION

In general terms, the invention involves adding a new grounding wire between the location(s) of interest/problem (such as from the bulk water tank or platform by a bulk water tank for the cows, establishing an equi-potential plane for the livestock) and a primary grounding location and service bond for the electrical system. A new sensing device, which will be referred to as a directional flow current transducer 10, is monitored to sense electrical flow within the new grounding wire, and thereby provide useful information assessing transient, directional and locational stray voltage/stray current issues.

The preferred directional flow current transducer 10 is provided by a combination of a loop-powered AC current transmitter 12 and an AC power transducer 14. The loop-powered AC current transmitter 12 is generally used to monitor the average current (which could be thought of as being in either or both directions), while the AC power transducer 14 is generally used to determine the direction of the current flow across the grounding wire (or, more precisely, the relative polarity of the current flow with respect to the relevant voltage neutral measurement). The direction flow current transducer 10 could also be added to existing, appropriately located ground wires.

Figure 1:
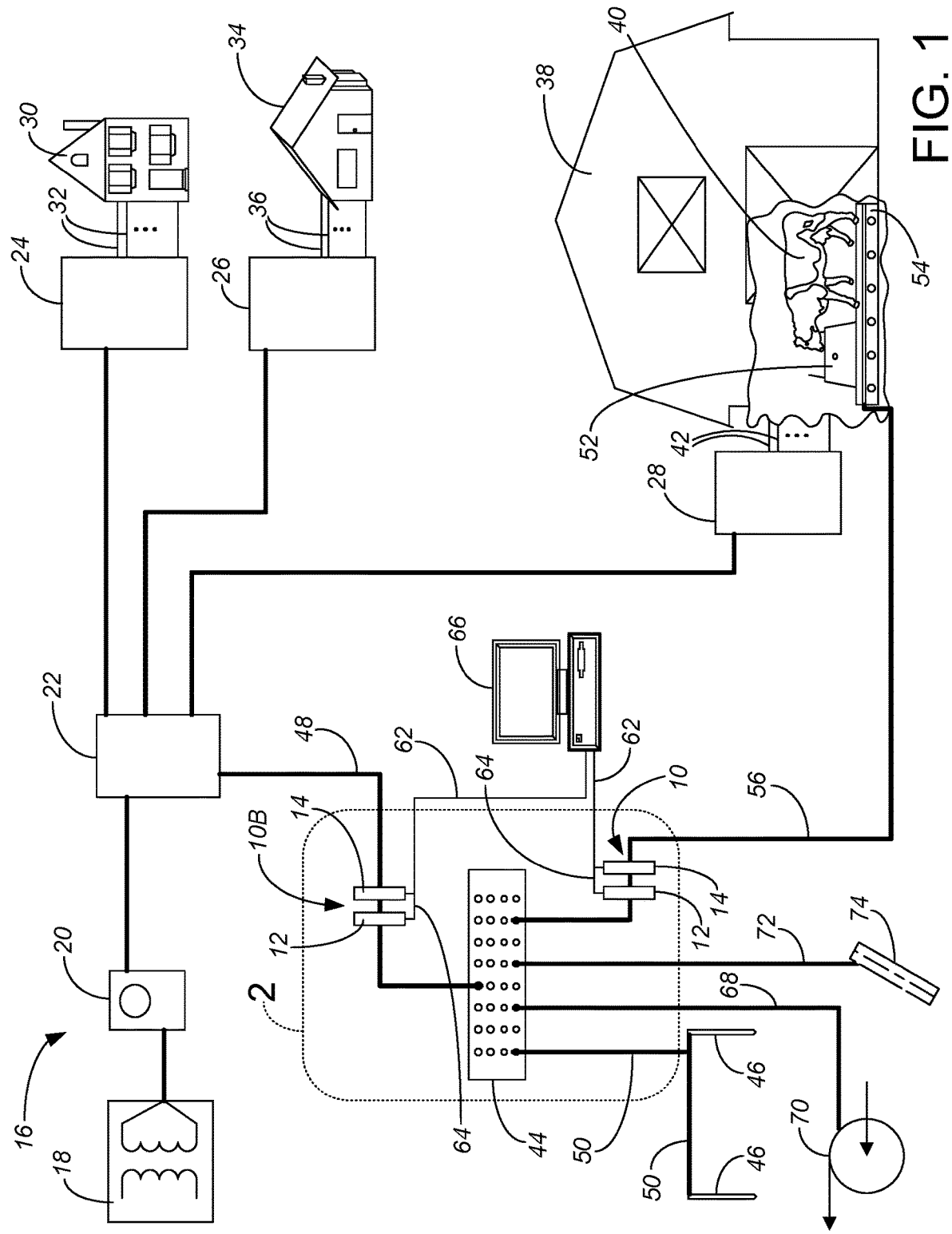
FIG. 1 is a schematic view of a typical farm electrical system, including a preferred transient stray voltage detection, measurement and logging system in accordance with the present invention.
Figure 2:
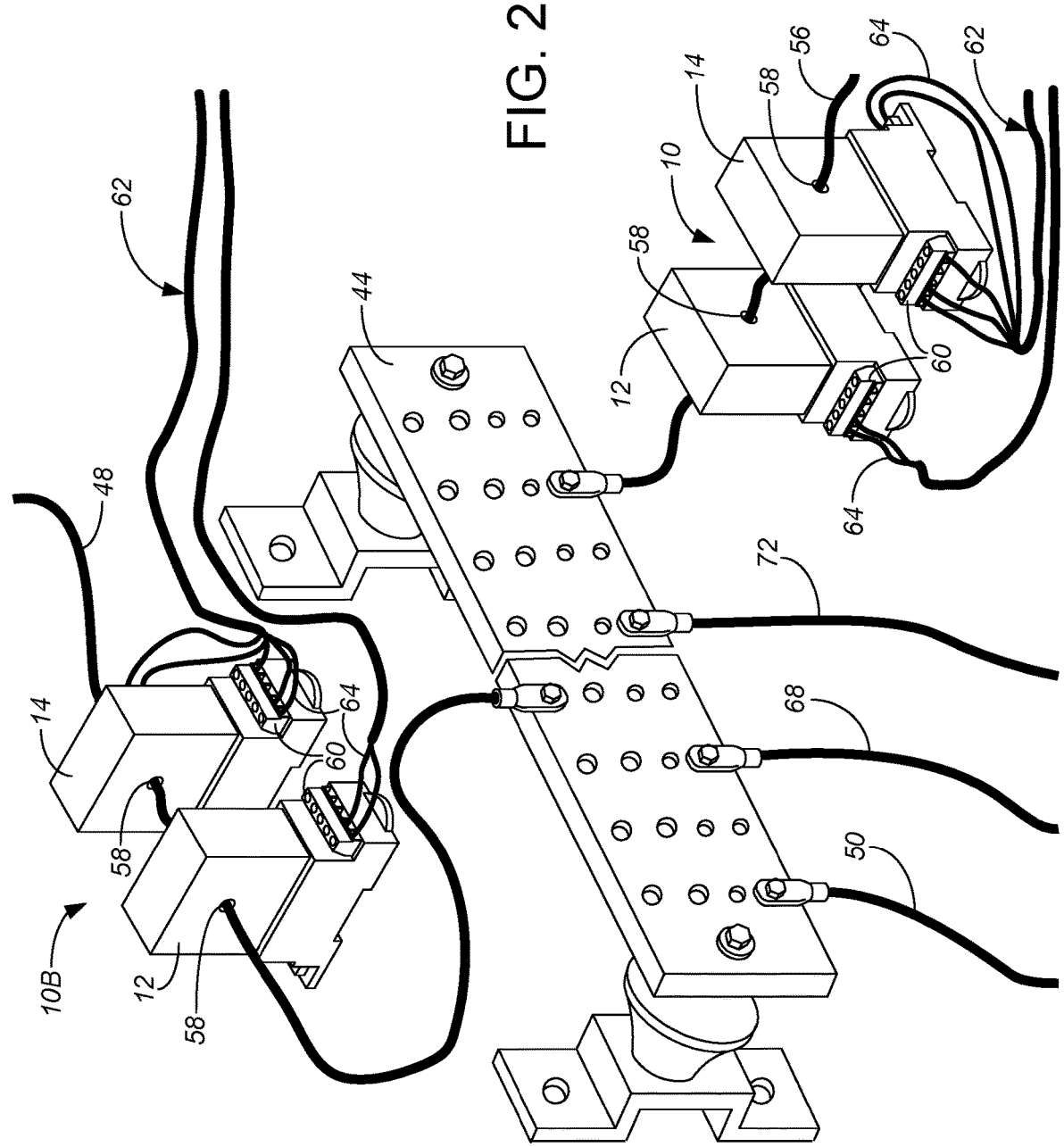
FIG. 2 is a perspective view of a portion of FIG. 1, better showing the ground bus bar and the preferred additional circuits and directional flow current transducers in accordance with the present invention.

FIGS. 1 and 2 exemplify a preferred embodiment of the present invention, employed on a farm. In the electrical system 16 for the farm, alternating current power is received in a utility step-down transformer 18 to reduce the voltage level from a level appropriate for transmission by the utility company down to a level appropriate for consumer use, such as down to a 120 or 240V, 60 Hz alternating power source. The alternating current power is carried between multiple conductor wires in the electrical system 16, usually at least one hot black-insulated wire, perhaps additional color-insulation hot wires, and at least one white-insulated or gray-insulated neutral wire (not separately shown). That alternating power source is commonly fed through a wattage meter 20 so the utility company can accurately charge the farmer for the power utilized on the farm, leading to the primary site electrical service panel 22. The primary site electrical service panel 22 includes the service bond for the electrical system 16, where the neutral is connected to ground. The primary site electrical service panel 22 will then distribute the power as known in the art such as through fuses or circuit breakers (not shown) to different circuits on the farm. In this exemplary embodiment, the electrical power is delivered through the primary site electrical service panel 22 to three different branch panels 24, 26, 28. One of the branch panels 24 is used for the house 30 or residence(s) on the farm, and again may include fuses or circuit breakers (not shown) to different circuits 32 for the house 30. The second branch panel 26 is used for a shop building 34 on the farm, again including fuses or circuit breakers to different circuits 36. The third branch panel 28 is used for the livestock facility 38, which could be a building for poultry but in this case is depicted as a barn 38 for dairy cattle 40. The dairy barn 38 may be a short distance or a significant distance from the primary site electrical service panel 22, anywhere from a few meters to hundreds of meters. In general, the full electrical system 16 on the farm can include whatever electrical circuits 32, 36, 42 off the main or branch panels 22, 24, 26, 28 which are appropriate for that particular building or location.

As is well known and widely practiced, the electrical system 16 for the farm may include a grounding system, a third set of wires or conductors other than the hot and neutral conductor wires, often colored green or uninsulated, which are not intended to continuously carry flowing electric current. The typical earth grounding system includes a ground bus bar 44 as well as one or more grounding rods 46 which are driven into the earth. The primary site electrical service panel 22 is electrically connected to the ground bus bar 44 through one or more grounding wires 48. The ground bus bar 44 is electrically connected to the earth grounding rods 46 through one or more grounding wires 50. The purpose of the grounding system is two-fold, to carry fault current back to the source with very little resistance or impedance, and to conduct small amounts of current so as to avoid the buildup of charge at any location within the electrical system 16. The grounding system plays an important role in minimizing the likelihood of an electrical fire, by allowing a fuse or circuit breaker to operate and turn off electricity thus ending the hazardous electrical fault condition. The grounding system also helps to avoid or minimize any electrical shocks from occurring when someone comes into contact with the electrical system 16 (such as when touching an electrical switch or electrical outlet). Each of the branch panels 24, 26, 28, in addition to being electrically connected to the primary site electrical service panel 22 with wires that carry electrical power, may be electrically connected with a grounding wire (not separately shown) to the primary site electrical service panel 22. Each of the branch panels 24, 26, 28 may additionally or alternative having their own grounding rods (not shown), but should not have a service bond between the grounding system and the neutral.

In this case the barn 38 includes a watering container or trough 52 for the dairy cows 40, in which the dairy cows 40 stand on a concrete platform 54 while drinking from the trough 52. The concrete platform 54 should include wire mesh or other conductive elements are embedded in or placed under the concrete, connected to the electrical grounding system to establish an equi-potential plane and minimize voltage potentials that may contact the livestock. The trough 52 might include an electric water heater (not separately shown) so ice does not form on the trough 52. The trough 52 might be a metal container, with either the metal container of the trough 52 or the electric water heater being separately electrically grounded.

In the case of a dairy farm, the production of concern is the milk output of the dairy herd. Water intake of the dairy herd is critically important toward milk production, and so a particularly egregious location for stray voltage is where the cows 40 are drinking water. We particularly want to ensure that the cows 40 are not conducting stray voltage between the concrete platform 54 and the trough 52, which stray voltage can bother the dairy cows 40 during drinking. The concrete platform 54 may often become wet, either as a result of precipitation and the cows 40 tracking water across the concrete platform 54, or as a result of the cows 40 splashing water from the trough 52. When the concrete platform 54 is wet, electricity is much more easily conducted from the concrete platform 54 through the cow hooves and body. In this case the new grounding wire 56 is added between the concrete platform 54 for the cows 40/equipotential plane and the primary ground bus bar 44 for the electrical system 16, with a directional flow current transducer 10 positioned on the new grounding wire 56. Of course, there are many other specific locations on the farm and in the livestock facility that may be of further interest to identify or eliminate stray voltages/stray currents including transient stray voltages/stray currents.

In the most preferred embodiment, the grounding wire 56 is an 8 gauge or thicker wire. An 8 gauge wire typically has an internal resistance of about 0.0006 Ω/ft, may be used for the grounding wire 56. The resistance of the grounding wire 56 then depends on the length of the grounding wire 56, such as 50 to 100 feet from the concrete pad 54 to the grounding bus bar 44, thus producing an internal resistance typically within the range of 0.03-0.06Ω. However, there are additional resistances, including between the concrete platform 54 and the earth, within the service bond, at the primary transformer 18, etc. that may affect the stray voltage/current loop, which are heavily site dependent. The present invention assumes a stray voltage/current loop resistance of 10Ω or less, and the directional flow current transducer 10 must be sensitive enough to sense a stray current value of 1 A or less, and more preferably sufficiently sensitive to sense a stray current value of 100 mA or less, such as a stray voltage value of 25 mA or less.

In the preferred embodiment, the directional flow current transducer 10 is provided by a combination two separate devices, each of which includes a window 58 which receives the new grounding wire 56 threaded therethrough without making metal-to-metal contact with the conductor in the new grounding wire 56. Each of the separate devices also includes a set of terminals 60 for connection into a signal sensing circuit 62 which includes wires 64. The preferred loop-powered AC current transmitter 12 is a CR4420-5 available from CR Magnetics of St. Louis, Mo. The preferred AC power transducer 14 is either a CR6220-150-5 (for use primarily with 120 V AC systems) or a CR6220-250-5 (for use primarily with 240 V AC systems), both also available from CR Magnetics. For these devices, the signal driving/sensing wires 64 are 22 gauge conductors or larger to thereby minimize connection resistance on most applications. Twisted pair wires 64 should be adequate for most applications but shielded/twisted pair wire with the shield grounded at the instrumentation end may be required for the most severe environments. Both the preferred loop-powered AC current transmitter 12 and the preferred AC power transducer 14 have a housing configuration for easy mounting on either a 35 mm DIN rail or in an electrical panel.

The preferred loop-powered AC current transmitter 12 is a variable resistance device that automatically adjusts its DC series resistance to maintain a DC current that is proportional to the average RMS value of the (most commonly AC) electrical current flowing through the window 58 of the transmitter 12. For use in the United States which mostly operates on a 60 Hz power grid, the AC current transmitter 12 is calibrated so its output is proportional to the average RMS of the current at 60 Hz. The preferred CR4420-5 AC current transmitter 12 derives power from an external DC power supply providing a 4-20 mA 24V loop, providing an analog output proportional to an AC throughput current on the grounding wire 56 of 0-5 A with a basic accuracy of 0.5% (i.e., a basic accuracy of 25 mA on the new grounding wire 56 meaning the analog output of the AC current transmitter 12 is ±0.08 mA) The total loop resistance (computer/reading instrument 66 plus wire 64) for the CR4420-5 should not exceed 600Ω. Most preferably, a computer/reading instrument 66 with a burden of 250Ω should be used. The preferred CR6220-150-5 AC power transducers 14 also utilize an external 4-20 mA 24V DC power supply, providing an analog output proportional to power throughput on the grounding wire 56 of 0-750 W with a basic accuracy of 0.5% (i.e., a basic accuracy of 3.75 W). Alternatively, the directional flow current transducer 10 could output digital readings.

Data from the directional flow current transducer 10 is stored and/or displayed as a function of time. In FIG. 1, the instrument for performing the storage and/or display of the data is shown as a general purpose computer 66, but the exact form of the computer will depend upon the devices used for the directional flow current transducer 10. In the most preferred embodiment, the electrical information provided by the loop-powered AC current transmitter 12 and by the power transducer 14 is read, logged, transmitted and displayed. In general terms, a controller/processor 66 (such as a TM2410E24T controller from Schneider Electric) is wired to drive and sense the loop-powered AC current transmitter 12 and AC power transducer 14 of each directional flow current transducer 10. The driving output of the controller/processor 66 provides a DC power supply of at least 24 VDC across the wires 64 to the directional flow current transducer 10, with a current rating of 20 mA or greater per transmitter 12 connected.

Depending upon the amount of on-board memory storage, the controller/processor 66 preferably logs the data, and may be programmed to generate alarms if the sensed stray current exceeds a dangerous level threshold, such as being in excess of 100 mA. The controller/processor 66 also preferably allows display of the measurement results in real time, such as by using a HMIGTO5315 10.4 inch Color Touch Screen from Schneider Electric. The controller/processor 66 also preferably allows transmission of the measurement results in real time, such as to be logged and displayed at remote locations, such as by using an IndustrialPro SN-6921-VZ five port router/modem (not separately shown) from Red Lion Controls and for use on Verizon's LTE network, to thereby be displayed in a smart phone application for remote viewing and logging.

The preferred embodiment depicted in FIGS. 1 and 2 also includes a second directional flow current transducer 10B. This second directional flow current transducer 10B is disposed on the grounding wire 48 between the main electrical service panel 22 (containing the service bond) and the grounding bus bar 44, thereby again assessing stray voltage/stray current problems based on grounding wire transmissions. In the most preferred embodiment, the second directional flow current transducer 10B is constructed identically to the first directional flow current transducer 10 described above, and simultaneously read, logged, transmitted and displayed using the same computer instrumentation 66 described above. If desired, further directional flow current transducers can be used on other grounding wires beyond the two depicted in FIGS. 1 and 2, such as between the ground bus bar 44 and other cow contact locations. For instance, further directional flow current transducers could be used on the grounding wires between any of the branch panels 24, 26, 28 and the main panel 22. The electrical system 16 depicted in FIGS. 1 and 2 also includes a grounding wire 68 for the farm water system 70 and a grounding wire 72 for structural steel 74, and data could alternatively or additionally be gathered from these grounding wires 68, 72 if the data from the grounding wires 56, 48 proves confusing or inconclusive.

Review of the data from the directional flow current transducers over time—including comparing data from different grounding wire locations—is very important in trying to make assessments regarding the source of the stray voltage/stray current problem. Often no conclusions can be drawn from a single reading at a single time. If the site is wired properly with no existing electrical equipment failures, no bad practices being followed by the utility company in the vicinity of the farm, and no weather related causes, the values returned by the directional flow current transducers can remain less than 25 mA for days or weeks. Knowledge of the direction of the transient stray voltage at different locations, particularly with transient electric current readings over 100 mA, is also helpful to pin point on-site or off-site sources of the undesirable stray voltage/stray current. A complete time based graphing system with history and comparisons between the two (or more) directional flow current transducers may be needed to make conclusions about the root cause of the stray voltage/stray current problem.

The preferred system has been tested on multiple farm sites, and the vast majority of stray voltages identified have a current direction flowing back to the transformer 18 or back toward the location of the utility company. If desired for cost purposes, it is possible to simply take current readings using only an AC current transmitter 12 without determining direction through the power transducer 14, and merely assume that the current direction is flowing back to the transformer 18 and/or back toward the location of the utility company. However, most commonly in late fall and early spring, the direction often reverses and flows away from the transformer 18 and/or away from the location of the utility company for 2 days to 3 weeks.

Although the present invention has been described with reference to preferred embodiments, workers skilled in the art will recognize that changes may be made in form and detail without departing from the spirit and scope of the invention.

The invention claimed is:

1. A transient stray voltage detector comprising:
   a first transducer, configured to be received adjacent a grounding wire of a farm, providing a first output signal indicative of magnitude of electric flow through the grounding wire over a sensing duration;
   a second transducer, configured to be received adjacent the grounding wire of the farm electrical system, providing a second output signal indicative of direction of electric flow through the grounding wire over the sensing duration,
   a processor, electrically connected to receive the output signals of the first and second transducers, logging the magnitude and direction of electric flow through the grounding wire as a function of time, wherein the first transducer and the second transducer collectively have a sensitivity sufficient to read a transient grounding wire current of 1 A or less.

2. The transient stray voltage detector of claim 1, wherein the first transducer has a variable resistance that automatically adjusts its DC series resistance, with the first output signal being a DC current signal that is proportional to an average RMS value of current flow through the grounding wire.

3. The transient stray voltage detector of claim 2, wherein the first transducer is an AC current transmitter.

4. The transient stray voltage detector of claim 3, wherein the AC current transmitter is calibrated to an average RMS value of an alternating current at 60 Hz.

5. The transient stray voltage detector of claim 4, wherein first transducer derives power from an external DC power supply.

6. The transient stray voltage detector of claim 1, wherein the first transducer comprises a window for receiving the grounding wire, such that the first transducer extends around and encircles the grounding wire, without making metal-to-metal connection with the grounding wire.

7. The transient stray voltage detector of claim 1, wherein the second transducer is an AC power transducer.

8. The transient stray voltage detector of claim 1, wherein the second transducer comprises a window for receiving the grounding wire, such that the second transducer extends around and encircles the grounding wire, without making metal-to-metal connection with the grounding wire.

9. The transient stray voltage detector of claim 8, wherein second transducer derives power from an external DC power supply.

10. An electrical system for a livestock facility, the electrical system comprising:
    a main electrical distribution panel receiving alternating current power and distributing the alternating current power to loads in the livestock facility through hot circuit wires relative to neutral circuit wires, the main electrical distribution panel also providing a service bond for the electrical system,
    an earth grounding circuit providing an earth ground for the service bond of the main electrical distribution panel, the earth grounding circuit comprising:
       a grounding rod within the earth; and
       at least a first grounding wire electrically connecting the main electrical distribution panel to the grounding rod;
    at least a first directional current transducer providing one or more output signals indicative of magnitude and direction of electric flow through at least one grounding wire at a sensing duration, the first directional current transducer having a sensitivity sufficient to read a transient grounding wire current of 1 A or less; and
    a data storage and/or display system reading the output signals of the first directional current transducer as a function of time.

11. The electrical system of claim 10, wherein the earth grounding circuit comprises:
    a ground bus bar, wherein the first grounding wire electrically connects the main electrical distribution panel to the grounding bus bar; and
    a second grounding wire electrically connecting the grounding bus bar to the grounding rod within the earth, and
    wherein the first directional current transducer comprises a window receiving the first grounding wire, such that the first directional current transducer extends around and encircles the first grounding wire, without making metal-to-metal connection with the first grounding wire.

12. The electrical system of claim 11, wherein the first directional current transducer comprises:
    an AC current transmitter comprising a window receiving the first grounding wire, such that the AC current transmitter extends around and encircles the first grounding wire, without making metal-to-metal connection with the first grounding wire; and
    an AC power transducer comprising a window receiving the first grounding wire, such that the AC power transducer extends around and encircles the first grounding wire, without making metal-to-metal connection with the first grounding wire.

13. The electrical system of claim 10, wherein the earth grounding circuit comprises:
- a ground bus bar, wherein the first grounding wire electrically connects the service bond of the main electrical distribution panel to the grounding bus bar;
- a second grounding wire electrically connecting the grounding bus bar to the grounding rod within the earth; and
- a third grounding wire electrically connecting an equi-potential plane of a livestock pad to the grounding bus bar;

and wherein the electrical system further comprises:
- a second directional current transducer providing one or more output signals indicative of magnitude and direction of electric flow through the third grounding wire at the sensing duration, the second directional current transducer having a sensitivity sufficient to read a transient grounding wire current of 1 A or less; and wherein the data storage and/or display system reads the output signals of the second directional current transducer as a function of time, such that the data storage and/or display system can simultaneously record and/or display both the output signals of the first directional current transducer and the output signals of the second directional current transducer.

14. The electrical system of claim 10, wherein the earth grounding circuit comprises:
- a ground bus bar, wherein the first grounding wire electrically connects the main electrical distribution panel to the grounding bus bar;
- a second grounding wire electrically connecting the grounding bus bar to the grounding rod within the earth, and
- a third grounding wire electrically connecting an equi-potential plane of a livestock pad to the grounding bus bar;

wherein the first directional current transducer comprises a window receiving the third grounding wire, such that the first directional current transducer extends around and encircles the third grounding wire, without making metal-to-metal connection with the third grounding wire.

15. The electrical system of claim 14, wherein the first directional current transducer comprises:
- an AC current transmitter comprising a window receiving the third grounding wire, such that the AC current transmitter extends around and encircles the third grounding wire, without making metal-to-metal connection with the third grounding wire; and
- an AC power transducer comprising a window receiving the third grounding wire, such that the AC power transducer extends around and encircles the third grounding wire, without making metal-to-metal connection with the third grounding wire.

16. A method of monitoring transient stray voltage for a livestock facility with an electrical system, the electrical system comprising:
- a main electrical distribution panel receiving alternating current power and distributing the alternating current power to loads in the livestock facility through hot circuit wires relative to neutral circuit wires, the main electrical distribution panel also providing a service bond for the electrical system, and
- an earth grounding circuit providing an earth ground for the main electrical distribution panel, the earth grounding circuit comprising:
  - a grounding rod within the earth; and
  - at least a first grounding wire electrically connecting the service bond of the main electrical distribution panel to the grounding rod;

the method comprising:
- running a second grounding wire electrically connecting an equi-potential plane of a livestock pad relative to the grounding rod;
- using a first directional current transducer providing one or more output signals indicative of magnitude and direction of electric flow through the second grounding wire, the first directional current transducer having a sensitivity sufficient to read a transient grounding wire current of 1 A or less; and
- storing and/or displaying the output signals of the first directional current transducer as a function of time.

17. The method of claim 16, further comprising:
- using a second directional current transducer providing one or more output signals indicative of magnitude and direction of electric flow through the first grounding wire, the second directional current transducer having a sensitivity sufficient to read a transient grounding wire current of 1 A or less; and wherein the data storage and/or display system reads the output signals of the second directional current transducer as a function of time, such that the data storage and/or display system can simultaneously record and/or display both the output signals of the first directional current transducer and the output signals of the second directional current transducer.

18. The method of claim 16, wherein the first directional current transducer comprises:
- an AC current transmitter comprising a window receiving the second grounding wire, such that the AC current transmitter extends around and encircles the second grounding wire, without making metal-to-metal connection with the second grounding wire; and
- an AC power transducer comprising a window receiving the second grounding wire, such that the AC power transducer extends around and encircles the second grounding wire, without making metal-to-metal connection with the second grounding wire.

19. The method of claim 16, wherein the livestock pad is a concrete floor of a barn, wherein the barn receives alternating current power run through the main electrical distribution panel, with a metal livestock watering container on the concrete floor, the metal livestock watering container being separately grounded through the main electrical distribution panel.

* * * * *